(12) United States Patent
Cha et al.

(10) Patent No.: US 7,745,338 B2
(45) Date of Patent: Jun. 29, 2010

(54) METHOD OF FORMING FINE PITCH HARDMASK PATTERNS AND METHOD OF FORMING FINE PATTERNS OF SEMICONDUCTOR DEVICE USING THE SAME

(75) Inventors: Ji-hoon Cha, Seoul (KR); Chang-ki Hong, Seongnam-si (KR); Kun-tack Lee, Suwon-si (KR); Woo-gwan Shim, Yongin-si (KR); Chang-sup Mun, Suwon-si (KR); Ho-wook Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 496 days.

(21) Appl. No.: 11/738,155

(22) Filed: Apr. 20, 2007

(65) Prior Publication Data

US 2008/0014752 A1 Jan. 17, 2008

(30) Foreign Application Priority Data

Jul. 11, 2006 (KR) .................. 10-2006-0064970

(51) Int. Cl.
*H01L 21/311* (2006.01)
*H01L 21/76* (2006.01)
*H01L 21/4763* (2006.01)

(52) U.S. Cl. .............. 438/700; 438/424; 438/637; 438/551

(58) Field of Classification Search ........... 438/700, 438/634, 631, 622, 424, 637, 551, 671, 717, 438/736, 950, 942
See application file for complete search history.

(56) References Cited

U.S. PATENT DOCUMENTS

| 6,271,561 | B2 * | 8/2001 | Doan | 257/316 |
| 6,677,240 | B1 * | 1/2004 | Tigelaar | 438/700 |
| 6,940,150 | B2 * | 9/2005 | Watanabe | 257/622 |
| 2008/0124866 | A1 * | 5/2008 | Eun et al. | 438/264 |

FOREIGN PATENT DOCUMENTS

| JP | 63-292645 | 11/1988 |
| KR | 20020072402 | 9/2002 |
| KR | 20040056432 | 7/2004 |
| KR | 20060011559 | 2/2006 |

* cited by examiner

*Primary Examiner*—Chuong A. Luu
(74) *Attorney, Agent, or Firm*—F. Chau & Associates, LLC

(57) ABSTRACT

A method of forming fine pitch hardmask patterns includes forming a hardmask layer on a substrate and forming a plurality of first mask patterns on the hardmask layer. A buffer layer is formed on the plurality of first mask patterns, and has an upper surface defining recesses between adjacent first mask patterns. Second mask patterns are formed within the recesses formed in the upper surface of the buffer layer. The buffer layer is partially removed to expose upper surfaces of the plurality of first mask patterns, and the buffer layer is then partially removed using the first mask patterns and the second mask patterns as an etch mask to expose the hardmask layer between the first mask pattern and the second mask pattern. Using the first mask patterns and the second mask patterns as an etch mask, the hardmask layer is etched to form hardmask patterns.

34 Claims, 8 Drawing Sheets

METHOD OF FORMING FINE PITCH HARDMASK PATTERNS AND METHOD OF FORMING FINE PATTERNS OF SEMICONDUCTOR DEVICE USING THE SAME

CROSS-REFERENCE TO RELATED PATENT APPLICATION

This application claims the benefit of Korean Patent Application No. 10-2006-0064970, filed on Jul. 11, 2006, the disclosure of which is hereby incorporated by reference herein in its entirety.

BACKGROUND OF THE INVENTION

1. Technical Field

The present disclosure relates to a method of forming hardmask patterns and to a method of forming fine patterns of a semiconductor device, and more particularly to a method of forming fine pitch hard mask patterns while using double patterning to overcome a resolution restriction of the exposure facility.

2. Description of the Related Art

To fabricate highly integrated semiconductor devices, one typically needs highly miniaturized patterns. For example, to integrate many elements within a small area, the individual elements should be smaller. The smaller dimensions may be obtained by reducing the pitch of the pattern. The pitch of the pattern is the sum of the width and the gap between adjacent patterns. However, with the significant decrease of design rules of semiconductor devices, a limit in forming patterns with a fine pitch may have been reached due to resolution restrictions of photolithography processes. The resolution restrictions of photolithography are especially significant when forming an isolation region that defines an active region in a substrate, and when forming a line and space pattern (hereinafter referred to as "L/S pattern").

To overcome the resolution restrictions of photolithography, spacers with a fine feature size have been formed on both side surfaces of one pattern, and a spacer pattern formed according to the spacers has been used as a hardmask, to pattern a film by etching. However, when the spacer pattern is used as a hardmask, a pair of right and left spacers formed on the sides of one reference pattern may become uneven. Generally, the spacers are made thicker than their desired thickness to ensure an even thickness of the right and left spacers. As a result, it may become difficult to remove the spacers after using them as a hardmask. Also, a hard mask in the form of the spacer is typically centered around the pattern to surround the pattern. Therefore, when a line pattern is formed using the spacers, separate trimming is required to separate the spacers as an individual line pattern.

Thus, there is a need for a method for forming fine pitch hard mask patterns and forming fine patterns of a semiconductor device using the same which overcomes the resolution restrictions of photolithography.

SUMMARY OF THE INVENTION

The exemplary embodiments of the present invention provide a method of forming fine pitch hardmask patterns used as an etch mask when embodying fine pitch patterns to overcome resolution restrictions of photolithography.

The exemplary present invention also provides a method of forming fine patterns of a semiconductor device for forming various patterns with a fine pitch required for fabricating a semiconductor device by using a method of forming fine pitch hardmask patterns.

In accordance with an exemplary embodiment of the present invention, a method of forming hardmask patterns is provided as set forth below. The method including forming a hardmask layer on a substrate. A plurality of first mask patterns are formed on the hardmask layer. Then, a buffer layer is formed on the plurality of first mask patterns, and an upper surface of the buffer layer defines recesses between adjacent first mask patterns. The method further includes forming second mask patterns within the recesses formed in the upper surface of the buffer layer, and partially removing the buffer layer to expose upper surfaces of the plurality of first mask patterns. The buffer layer is then partially removed using the plurality of first mask patterns and the second mask patterns as an etch mask to expose the hardmask layer between the first mask pattern and the second mask pattern. Using the plurality of first mask patterns and the second mask patterns as an etch mask, the hardmask layer is etched to form hardmask patterns.

After forming the plurality of first mask patterns and before forming the buffer layer, the hardmask layer exposed between the plurality of first mask patterns is removed from the upper surface of the hardmask layer to a depth equal to a first thickness to form low surface portions of the hardmask layer. In this case, the buffer layer covers the plurality of first mask patterns and the low surface portions to the first thickness. The portions of the buffer layer may be wet etched or dry etched.

In accordance with an exemplary embodiment of the present invention, a method of forming hardmask patterns is provided as set forth below. The method including forming a hardmask layer on a substrate and forming a plurality of first mask patterns on the hardmask layer at a first pitch. The method further includes forming a buffer layer to cover the plurality of first mask patterns, and having an upper surface having recesses between adjacent first mask patterns. Second mask patterns are formed to fill the recesses formed in the upper surface of the buffer layer. The buffer layer is partially removed to simultaneously expose upper surfaces of the plurality of first mask patterns and the upper surfaces of the second mask patterns. Thereafter, the buffer layer is partially removed using the plurality of first mask patterns and the second mask patterns as an etch mask to expose the upper surface of the hardmask layer between the first mask pattern and the second mask pattern. By etching the hardmask layer using the first mask patterns and the second mask patterns as an etch mask, a plurality of hardmask patterns are formed at a second pitch which is about ½ of the first pitch.

In accordance with an exemplary of the present invention, a method of forming fine patterns of a semiconductor device is provided as set forth below. The method including forming a first oxide film on a substrate and forming a hardmask layer by stacking a nitride film and a second oxide film on the first oxide film. The method further includes forming a plurality of first mask patterns on the second oxide firm. A third oxide film is formed on the first mask patterns, and the third oxide film has an upper surface that defines recesses between adjacent first mask patterns. Second mask patterns are formed within the recesses formed in the upper surface of the third oxide firm, and the third oxide film is partially removed to expose the upper surfaces of the first mask patterns. The third oxide film is then partially removed to expose the hardmask layer using the first mask patterns and the second mask patterns as an etch mask. Moreover, the method includes etching the hardmask layer using the first mask patterns and the second mask patterns as an etch mask to form hardmask patterns, and etching the first oxide film and the substrate a using the hardmask patterns as an etch mask to form trenches in the substrate. Then, the trenches are filled with an insulating film to form an isolation region.

In accordance with an exemplary embodiment of the present invention, a method of forming fine patterns of a semiconductor device is provided as set forth below. The method including forming a hard mask layer on an etch firm subjected to etching on a substrate. A plurality of first mask patterns are formed on the hardmask layer. Then, a buffer layer is formed on the first mask patterns, and has an upper surface defining recesses between adjacent first mask patterns. Second mask patterns are formed within the recesses formed in the upper surface of the buffer layer, and the buffer layer is partially removed to expose upper surfaces of the first mask patterns. The buffer layer is then partially removed using the first mask patterns and the second mask patterns as an etch mask to expose the hardmask layer. The method further includes etching the hard mask layer using the first mask patterns and the second mask patterns as an etch mask to form hardmask patterns, and etching the etch film using the hardmask patterns as an etch mask.

According to exemplary embodiments of the present invention, double patterning is used by forming the first mask patterns at about twice the pitch of the intended final patterns, and then forming second mask patterns in the spaces between adjacent first mask patterns. Therefore, repeated patterns can be formed at a fine pitch of about ½ that typically embodied by photolithography, to thereby readily overcome the resolution restrictions of photolithography.

BRIEF DESCRIPTION OF THE DRAWINGS

Exemplary embodiments of the present invention can be understood in more detail from the following detailed description taken in conjunction with the attached drawings in which.

DETAILED DESCRIPTION OF THE EXEMPLARY EMBODIMENTS OF THE INVENTION

Figure 1A:
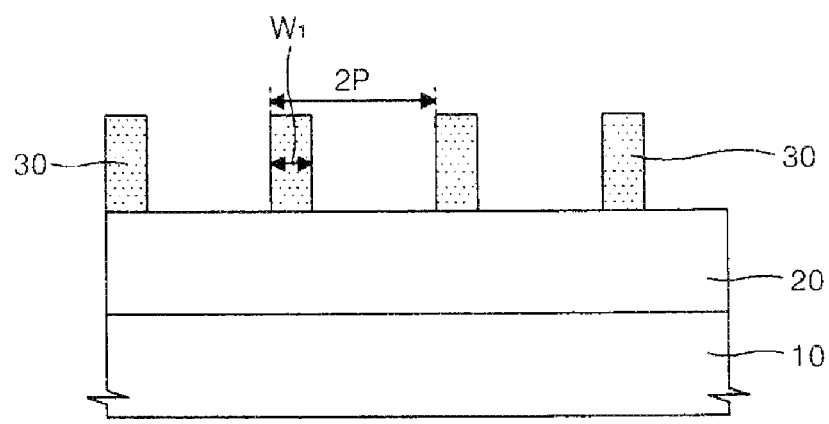
FIGS. 1A through 1H are sectional views illustrating a method of forming fine pitch hardmask patterns according to an exemplary embodiment of the present invention.

The present invention will now be described more fully with reference to the accompanying drawings, in which exemplary embodiments of the invention are shown. The invention may, however, be embodied in many different forms, and should not be construed as being limited to the exemplary embodiments set forth herein. In the drawings, the thicknesses of layers and regions are exaggerated for clarity.

FIGS. 1A through 1H are sectional views illustrating a method of forming fine pitch hardmask patterns according to an exemplary embodiment of the present invention.

Referring to FIG. 1A, a hardmask layer 20 is formed on a substrate 10. Using photolithography, a plurality of first mask patterns 30 are formed on the hardmask layer 20.

The plurality of first mask patterns 30 has a first pitch 2P that is about twice the pitch P of hardmask patterns intended to be finally formed. A first width $W_1$ of the first mask patterns 30 may be about ¼ of the first pitch 2P. The first mask patterns 30 may be formed of a plurality of line patterns repeatedly formed in a predetermined direction at the first pitch 2P on the substrate 10.

The hardmask layer 20 may be composed of various materials according to the material of an etch film subjected to etching and the usage of the patterns to be formed. For example, when forming a trench for defining an active region in the substrate 10, the hardmask layer 20 may be an oxide film, a nitride film or a combination of these films. Otherwise, if the film to be etched is an insulating layer or a conductive layer, the hardmask layer 20 may be composed of a material selective to the material of that film.

The hardmask layer 20 and the first mask patterns 30 are composed of materials having different etching characteristics, e.g. materials having different etch selectivities under certain etching conditions. For example, the hardmask layer 20 may be composed of thermal oxide, chemical vapor deposition (CVD) oxide, undoped silicate glass (USG) and/or high density plasma (HDP) oxide. Also, the hardmask layer 20 may be composed of nitride, e.g. silcon oxynitride (SiON), silicon nitride (SiN), silicon boronitride (SiBN) and boronitride (BN). Otherwise, the hardmask layer 20 may have a stacked structure of one of the above nitride films and one of the above oxide films.

The first mask patterns 30 may be composed of, for example, polysilicon. If the hardmask layer 20 is a nitride film, the first mask patterns 30 may be an oxide film, e.g. a silicon on glass (SOG) film or a flowable oxide (FOX) film, with improved planarization characteristics. The material constituting the first mask patterns 30 may be determined by considering the material of the hardmask layer 20 or the material of the film to be etched.

Figure 1B:
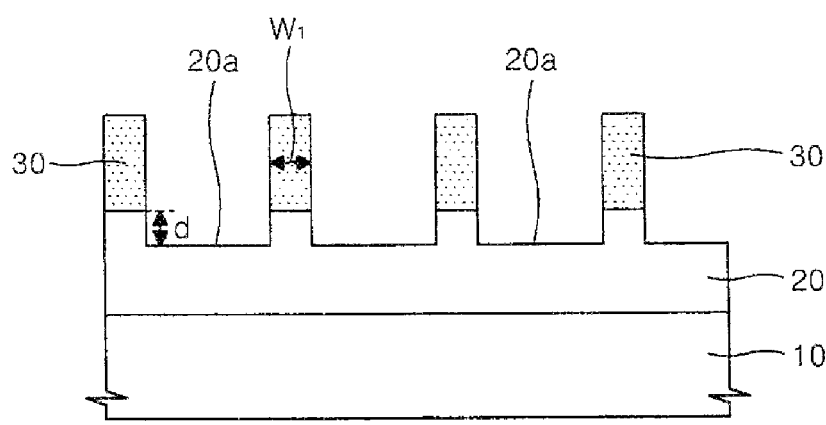

Referring to FIG. 1B, the hardmask layer 20 exposed between the first mask patterns 30 is removed to a depth equal to a first thickness d from the upper surface, thereby forming low surface portions 20a of the hardmask layer 20.

The first thickness d may be equal to the first width $W_1$ of the first mask pattern 30.

The low surface portions 20a may be formed by, for example, dry etching the upper surface of the hardmask layer 20. For example, when forming the first mask patterns 30 described with reference to FIG. 1A, over-etching follows the forming of the first mask patterns 30 during the dry etching for forming the first mask patterns 30, thereby forming the low surface portions 20a. Alternatively, dry etching may be separately performed to from the low surface portions 20a.

In the current exemplary embodiment, the hardmask layer 20 is a single layer, but the exemplary embodiments of the present invention are not limited thereto. In addition, the low surface portions 20a may be formed of an upper portion corresponding to the first thickness d of a different material to a lower portion. In this case, the low surface portions 20a may be formed by etching using the etch selectivity of the upper material and the lower material of the hardmask layer 20.

Figure 1C:
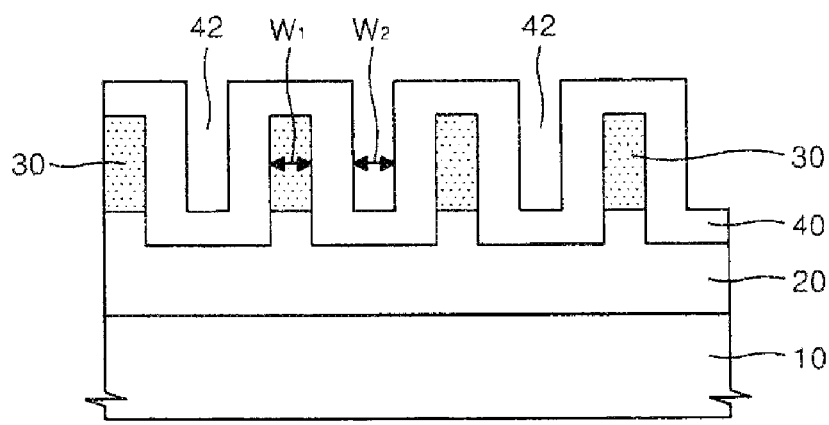

Referring to FIG. 1C, a buffer layer 40 with an upper surface that defines a recess 42 between two adjacent first mask patterns 30 out of the plurality of first mask patterns 30 is formed on the first mask patterns 30.

The buffer layer 40 ensures that the height of the first mask patterns 30 that will be used as an etch mask for patterning the hardmask layer 20 is the same as the height of second mask patterns (50a of FIG. 1E) that will be formed within the recesses 42 in a subsequent process.

The buffer layer 40 may consistently cover the upper surfaces and sidewalls of the first mask patterns 30, and the low surface portions 20a of the hardmask layer 20. The buffer layer 40 may consistently cover the first mask patterns 30 and the lower surface portions 20a of the hardmask layer 20 by the first thickness d. Also, the thickness of the buffer layer 40 is determined such that a second width $W_2$ of the recess 42 defined by the upper surface of the buffer layer 40 is the same as the first width $W_1$ of the first mask pattern 30.

The buffer layer 40 may be composed of a material having similar etch characteristics to the hardmask layer 20. For example, the buffer layer 40 may be composed of the same material as the hard mask layer 20. Otherwise, the buffer layer 40 may be composed of a different material to the hard mask layer 20, but having similar etch characteristics. For example, the hard mask layer 20 and the buffer layer 40 may each be an oxide layer. The buffer layer 40 may be, for example, an oxide layer formed by atomic layer deposition (ALD).

Figure 1D:
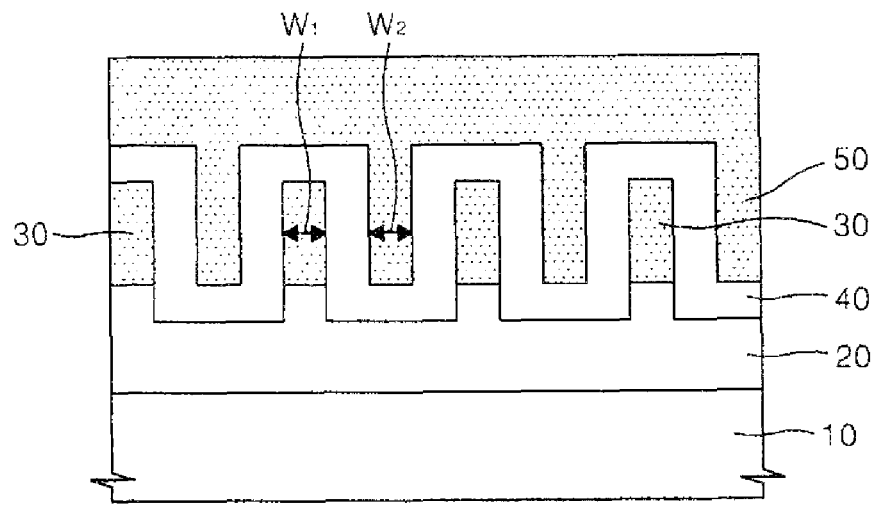

Referring to FIG. 1D, a second mask layer 50 is formed on the substrate 10 on which the buffer layer 40 is formed. The second mask layer 50 may be composed of a material with etch characteristics the same as or similar to those of the first mask pattern 30. The second mask layer 50 may be composed of, for example, polysilicon.

By forming the second mask layer 50, the recesses 42 are filled with the second mask layer 50. When the thickness of the buffer layer 40 is about ¼ of the first pitch 2P, the width $W_2$ of the recesses 42 and thus the width of the portions filling the recesses 42 is about ¼ of the first pitch 2P, e.g., the width $W_1$ of the first mask patterns 30.

Figure 1E:
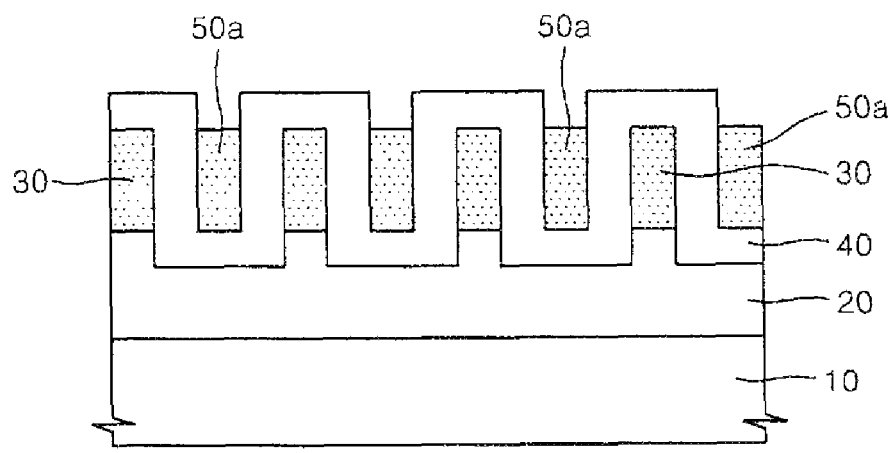

Referring to FIG. 1E, the second mask layer 50 is partially removed to form second mask patterns 50a within the recesses 42. By doing so, the buffer layer 40 covering the first mask patterns 30 between the plurality of second mask patterns 50a is exposed.

When partially removing the second mask layer 50, the amount of etching of the second mask layer 50 can be adjusted so that the upper surfaces of the second mask patterns 50a have the same level as the upper surfaces of the first mask patterns 30. For example, wet etching may be used to partially remove the second mask layer 50.

The second mask patterns 50a may form a plurality of line patterns extending in the same direction as the first mask patterns 30. The second mask patterns 50a remaining within the recesses 42 occupy approximately the same horizontal plane as the first mask patterns 30.

Figure 1F:
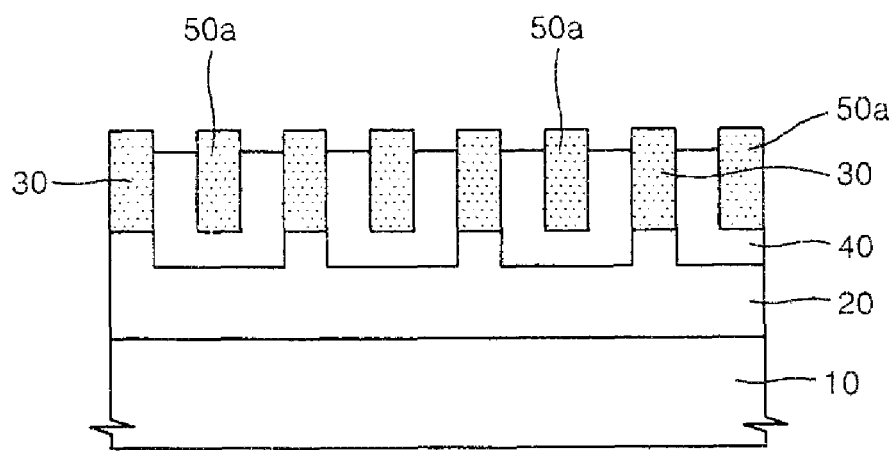

Referring to FIG. 1F, exposed portions of the buffer layer 40, e.g. portions covering upper surfaces of the first mask patterns 30, are removed to expose the upper surfaces of the first mask patterns 30. Thus, the upper surfaces of the first mask patterns 30 and the upper surfaces of the second mask patterns 50a are simultaneously exposed.

If the process described with reference to FIG. 1F is not performed, that is, if the portions of the buffer layer 40 covering the upper surfaces of the first mask patterns 30 are not removed in advance, the buffer layer 40 is also left on the upper surfaces of the first mask patterns 30 when etching is performed to remove the buffer layer 40 exposed between the first mask patterns 30 and the second mask patterns 50a during a subsequent process using the first and second mask patterns 30 and 50a as an etch mask. Therefore, the buffer layer 40 is etched white the first mask pattern 30 portions and the second mask pattern 50a portions are stepped due to the buffer layer 40. As a result, the etch amount of the first mask patterns 30 and the second mask patterns 50a used as the etch mask during etching for removing the buffer layer 40 between the first mask patterns 30 and the second mask patterns 50a differs from each other. Thus, the height of the first mask patterns 30 may differ from the height of the second mask patterns 50a after etching. For example, as the etch selectivity between the buffer layer 40 and the first mask pattern 30 and the second mask pattern 50a is smaller in an etching ambient for etching the buffer layer 40, the height difference of the first mask pattern 30 and the second mask pattern 50a is increased. If the first mask pattern 30 and the second mask pattern 50a have different heights when used as an etch mask to perform etching for patterning an underlying structure, an asymmetrical structure may be inadvertently formed.

In the method of forming the hardmask patterns according to an exemplary embodiment of the present invention, as described with reference to FIG. 1F, the portions covering the upper surfaces of the first mask patterns 30 out of the buffer layer 40 are removed in advance, thereby simultaneously exposing the upper surfaces of the first mask patterns 30 and the upper surfaces of the second mask patterns 50a on the substrate 10. Accordingly, the heights of the first mask patterns 30 and the second mask patterns 50a are maintained at a similar level even after removing the buffer layer 40 exposed between the first mask patterns 30 and the second mask patterns 50a as the etch mask in the subsequent process. This prevents difficulties such as the asymmetrical structure during subsequent etching for patterning the lower structure using the first mask patterns 30 and the second mask patterns 50a as the etch mask.

The portions of the buffer slayer 40 which cover the upper surfaces of the first mask patterns 30 may be removed, for example, by wet etching. For example, when the buffer layer 40 is an oxide layer, and the first mask patterns 30 and the second mask patterns 50a are composed of polysilicon, the buffer layer 40 has a relatively high etch selectivity to the first mask pattern 30 and the second mask pattern 50a, and may be selectively removed by an etchant including fluoride (F). For example, the etchant may be diluted hydrogen fluoride (DHF), ammonium fluoride ($NH_4F$), or a combination of these materials. Particularly, the etchant may be DHF obtained by mixing pure water and HF at a volume ratio of about 50:1.

Also, dry etching may be used to remove the portions of the buffer layer 40 which cover the upper surfaces of the first mask patterns 30. For example, when the buffer layer 40 is an oxide film, and the first mask patterns 30 and the second mask patterns 50a are composed of polysilicon, the buffer layer 40 has a relatively high etch selectivity to the first mask pattern 30 and the second mask pattern 50a, and may be selectively removed by an etchant including fluoride (F). For example, a fluorocarbon, e.g., CxFy (where x and y are each an integer from one to ten) may be used as the etchant. Otherwise, a mixed gas obtained by mixing CxFy (where x and y are each an integer from one to ten), oxygen ($O_2$) and argon (Ar) may be used as the etchant. The CxFy gas may be, for example, hexafluorobutadiene ($C_4F_6$) or octafluorocyclobutane ($C_4F_8$).

When the portions of the buffer layer 40 which cover the upper surfaces of the first mask patterns 30 are dry etched, plasma of the etchant is generated within the etching chamber to perform etching. Alternatively, no plasma may be generated in certain cases, so that etching may be performed in the etchant ambient with no ion energy.

Figure 1G:
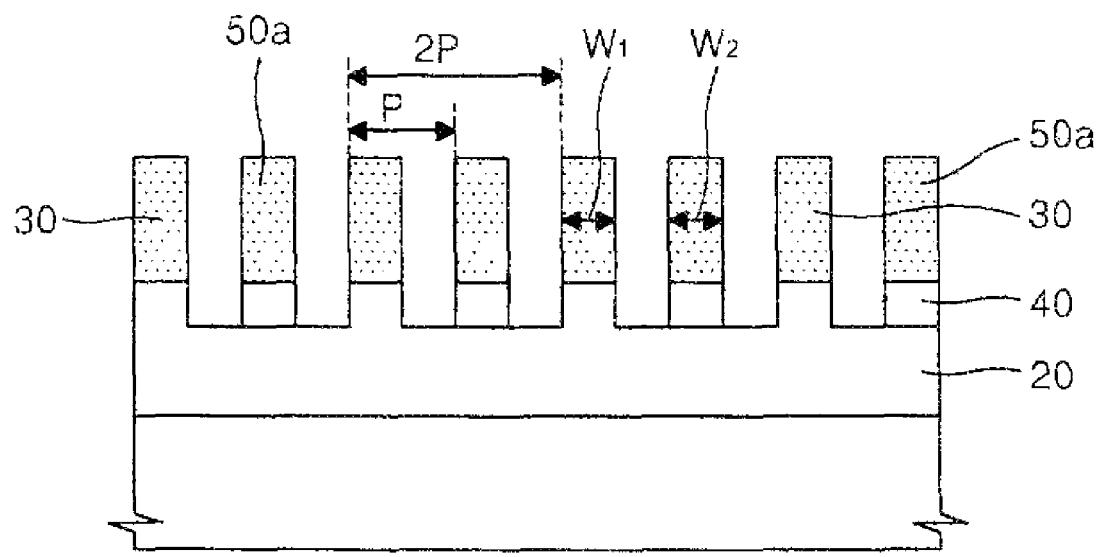

Referring to FIG. 1G, using the first mask patterns 30 and the second mask patterns 50a as an etch mask, the buffer layer 40 is anisotropically etched to expose the upper surfaces of the hardmask layer 20 between the first mask patterns 30 and the second mask patterns 50a.

Here, the second mask pattern 50a may have the second width $W_2$, e.g. the same as the width $W_1$ of the first mask pattern 30, which is about ¼ of the first pitch 2P. In this case, a mask pattern having the pitch P which is about ½ of the first pitch 2P may be formed by the first mask patterns 30 having the first width $W_1$ and the second mask patterns 50a having the second width $W_2$ on the hardmask layer 20 on the substrate 10.

Figure 1H:
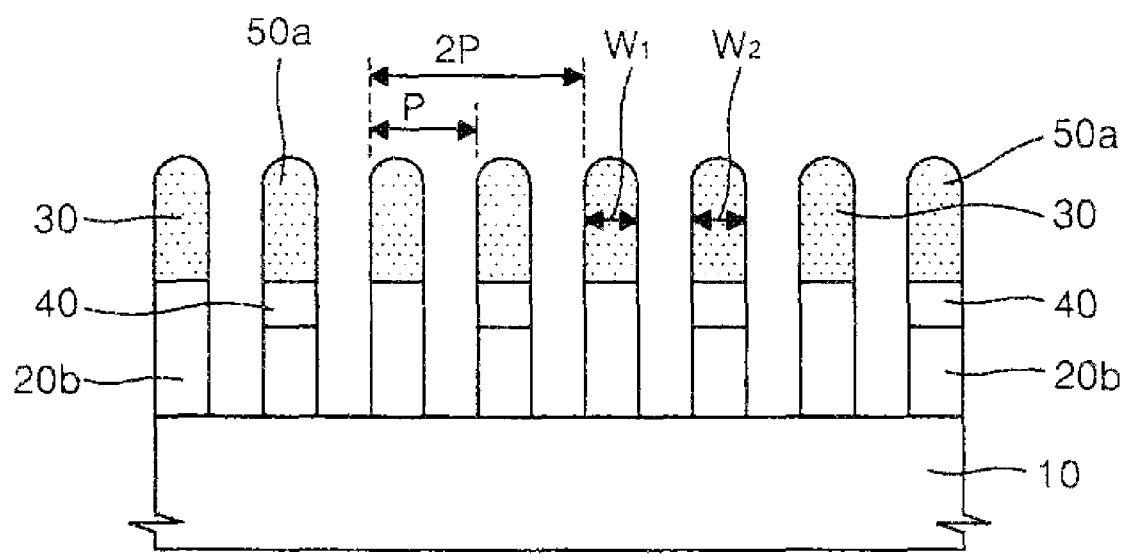

Referring to FIG. 1H, the hard mask layer 20 is anisotropically dry-etched using the first mask patterns 30 and the second mask patterns 50a as an etch mask, thereby forming hardmask patterns 20b repeatedly formed at the fine pitch P which is about ½ of the first pitch 2P. In the resultant structure illustrated in FIG. 1H, the first mask patterns 30 and the second mask patterns 50a are partially removed after dry etching of the hardmask layer 20.

FIGS. 2A through 2E are sectional views illustrating a method of forming fine patterns of a semiconductor device using a method of forming a fine pitch hardmask according to an exemplary embodiment of the present invention. In FIGS. 2A through 2E, reference numerals common to FIGS. 1A through 1H denote equivalent elements.

Figure 2A:
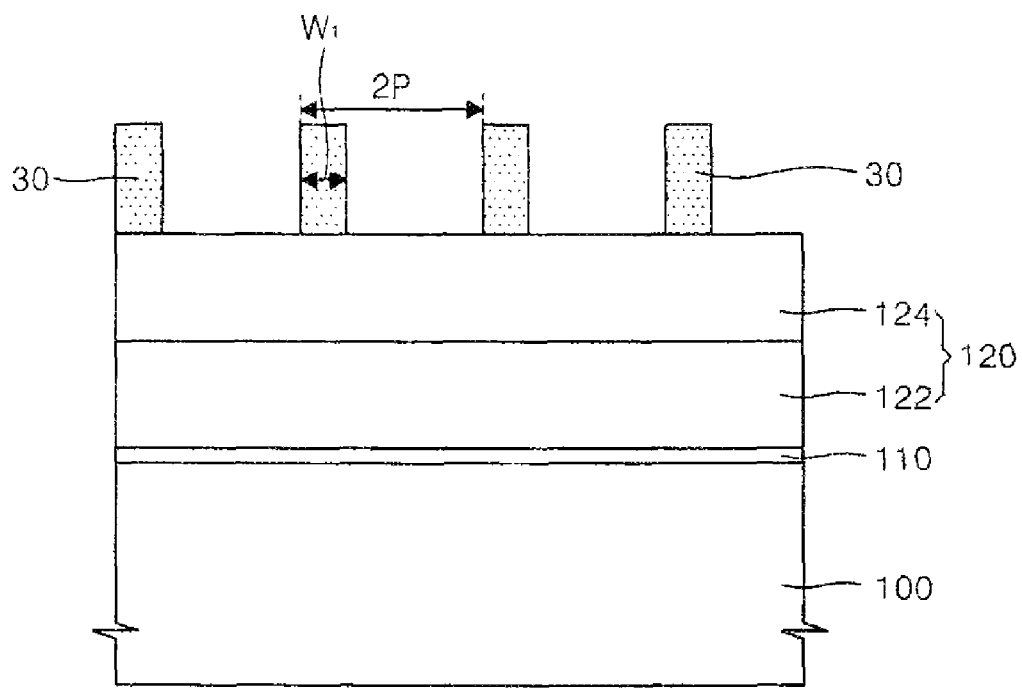
FIGS. 2A through 2E are sectional views illustrating a method of forming fine patterns of a semiconductor device using a method of forming fine pitch hardmask patterns according to an exemplary embodiment of the present invention.

Referring to FIG. 2A, a pad oxide film 110 is formed on a semiconductor substrate 100. Similar to the forming of the hardmask layer 20 and the first mask patterns 30 described with reference to FIG. 1A, a hardmask layer 120 and first mask patterns 30 are formed on the pad oxide layer film 110. However, in the current exemplary embodiment, the hardmask layer 120 has a structure of a nitride film 122 and an oxide film 124 sequentially stacked.

Figure 2B:
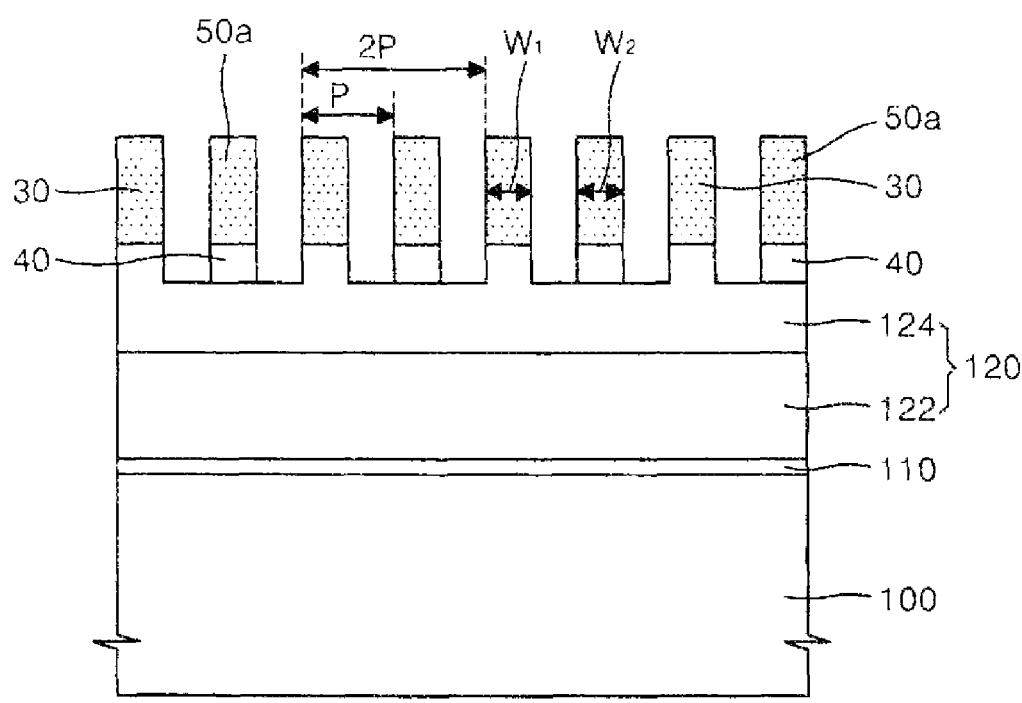

Referring to FIG. 2B, a buffer layer 40 and second mask patterns 50a are formed on the oxide film 124 of the hardmask layer 120 according to the method described with reference to FIGS. 1B through 1G.

Figure 2C:
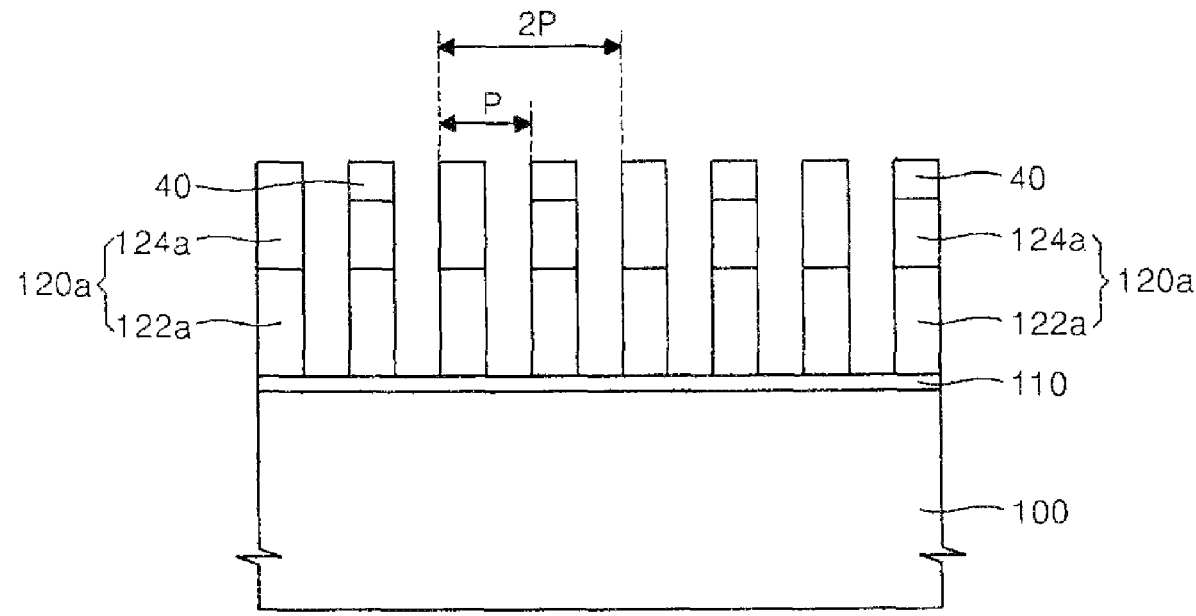

Referring to FIG. 2C, using the first mask patterns 30 and the second mask patterns 50a as an etch mask, the oxide film 124 and the nitride film 122 that constitute the hardmask layer 120 are sequentially anisotropically dry-etched, to form oxide film patterns 124a and nitride film patterns 122a. The oxide film patterns 124a and the nitride film patterns 122a form hardmask patterns 120a repeatedly formed at the fine pitch P which is about ½ of the first pitch 2P.

FIG. 2C does not illustrate the first mask pattern 30 or the second mask pattern 50a, as they are completely removed during the dry etching the oxide film 124 and the nitride film 122. Also, the buffer layer 40 remains on the oxide film patterns 124a. However, the current method of forming the fine patterns of the semiconductor device according to exemplary embodiments of the present invention is not limited to the drawings. In some cases, a portion of the oxide film patterns 124a, a portion of the buffer layer 40, or a portion or all of the pad oxide film 110 may be removed during etching until reaching the nitride film 122.

Figure 2D:
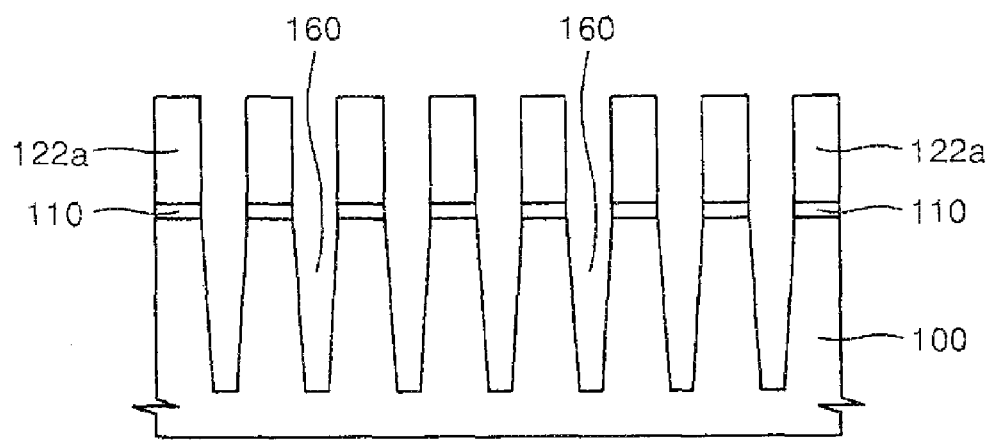

Referring to FIG. 2D, using the hardmask patterns 120a as an etch mask, the semiconductor substrate 100 is anisotropically etched to form trenches 160 in the semiconductor substrate 100. If the pad oxide film 110 is not thoroughly removed during etching of the nitride film 122 described with reference to FIG. 2C, the pad oxide layer 110 remaining on the semiconductor substrate 100 is first etched prior to etching the semiconductor substrate 100.

FIG. 2D illustrates that the oxide film pattern 124a and the buffer layer 40 are completely removed, leaving no remains, by dry etching the semiconductor substrate 100 when forming the trenches 160. However, the current method of forming the fine patterns of the semiconductor device according to exemplary embodiments of the present invention is not limited to the drawings. In some cases, the oxide film patterns 124a and the buffer layer 40 may be left on the nitride film patterns 122a.

Figure 2E:
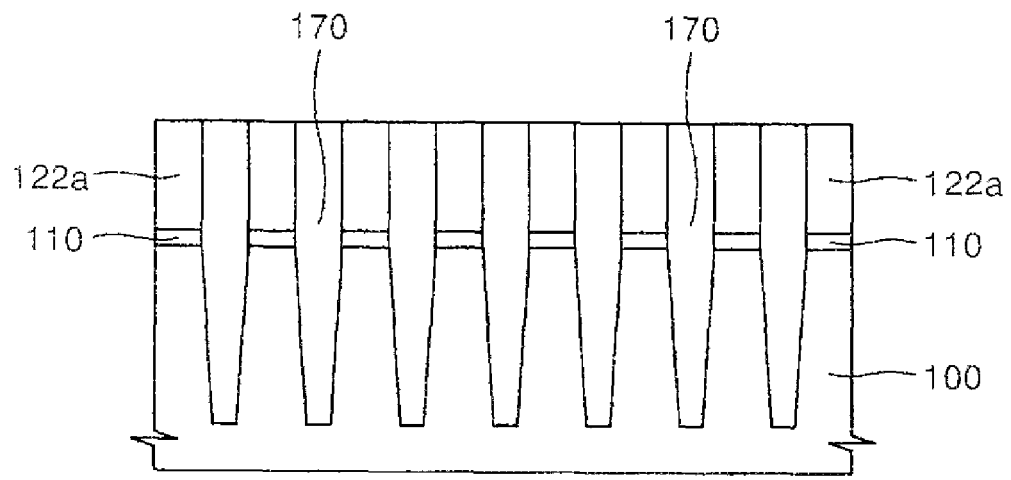

Referring to FIG. 2E, after an insulating material is deposited in the trenches 160 and on the nitride film patterns 122a, the resultant structure is planarized by, for example, chemical mechanical polishing (CMP) until the nitride film patterns 122a are exposed, so that an insulating film 170 is left filling the trenches 160, thereby forming an isolation region.

As described with reference to FIGS. 2A through 2E, the trenches 160 are formed in the semiconductor substrate 100 to form the isolation region. Thus, patterns for isolation can be repeatedly formed at a fine pitch of about ½ that typically embodied by photolithography, thereby exceeding the resolution restrictions of photolithography.

Figure 3A:
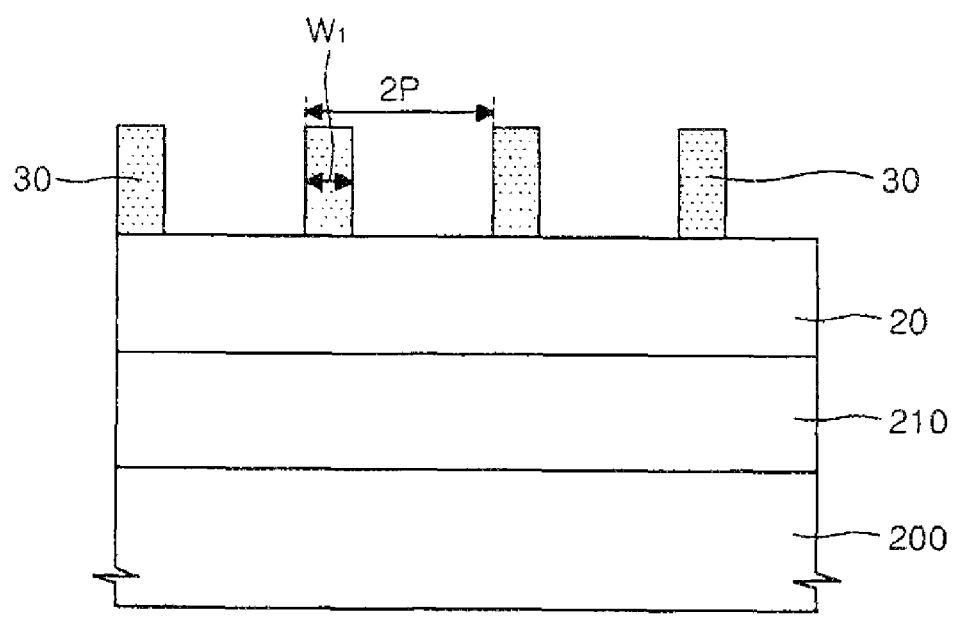
FIGS. 3A through 3C are sectional views illustrating a method of forming fine patterns of a semiconductor device using a method of forming fine pitch hardmask patterns according to an exemplary embodiment of the present invention.
Figure 3B:
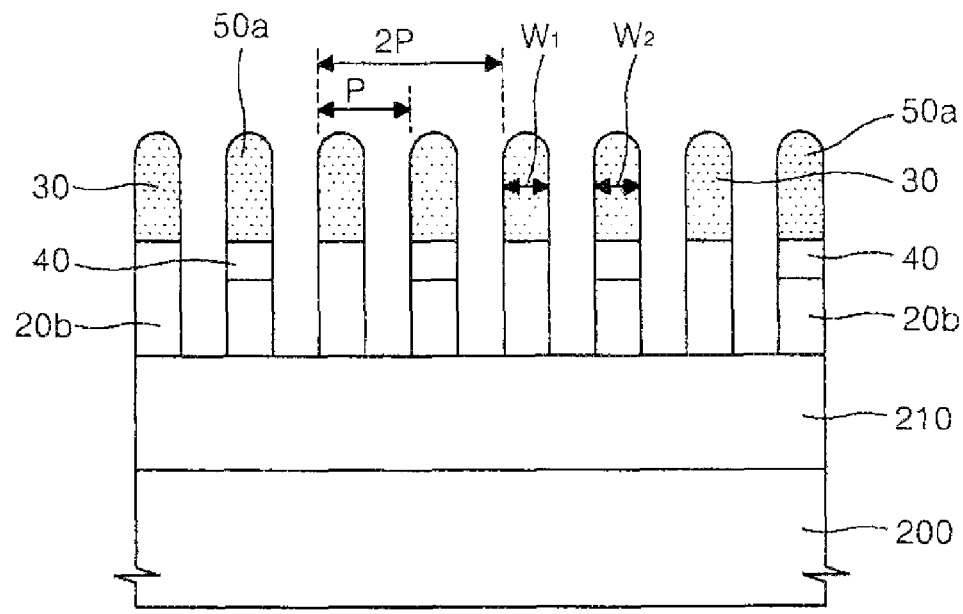
Figure 3C:
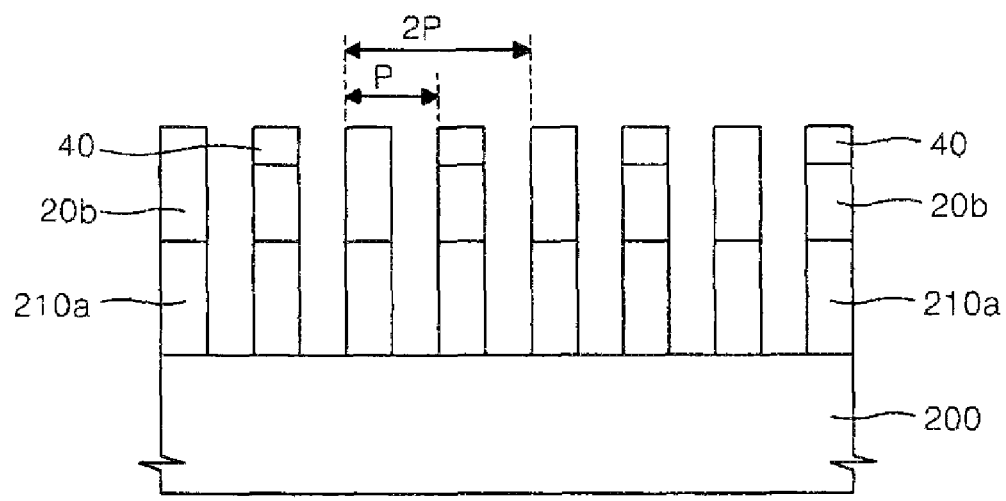

FIGS. 3A through 3C are sectional views illustrating a method of forming fine patterns of a semiconductor device using a method of forming a fine pitch hardmask according to another exemplary embodiment of the present invention. In FIGS. 3A through 30, reference numerals common to FIGS. 1A through 1H denote equivalent elements.

Referring to FIG. 3A, an etch film 210, to be later etched, is formed on a substrate 200.

The etch film 210 may be composed of various materials according to the usage of the patterns to be formed. For example, when an active region is defined on a substrate 200, the etch film 210 may be composed of silicon. When a gate electrode is to be formed on the substrate 200, the etch film 210 may be formed of a conductive layer of, e.g. doped polysilicon, or a stacked structure of doped polysilicon and metal silicide. Also, when a bit line is to be formed on the substrate 200, the etch film 210 may be composed of a metal, e.g. tungsten or aluminium.

A hard mask layer 20 and first mask patterns 30 are formed on the etch film 210 by the method described with reference to FIG. 1A. In this case, the first mask patterns 30 are formed of a plurality of line patterns repeatedly formed on the substrate 200 in a predetermined direction at a first pitch 2P.

Referring to FIG. 3B, second mask patterns 50a are formed on the hard mask layer 20 by the method described with reference to FIGS. 18 through 1H. In this case, the second mask patterns 50a form a plurality of line patterns extending in the same direction as the first mask patterns 30. Also, the second mask patterns 50a occupy approximately the same plane as the first mask patterns 30.

Subsequently, the hardmask layer 20 is etched using the first mask patterns 30 and the second mask pattern 50a as an etch mask, thereby forming hardmask patterns 20B. The etch film 210 is partially exposed by the hardmask pattern 20b.

Referring to FIG. 3C, using the hardmask patterns 20b as an etch mask, the exposed portions of the etch film 210 are anisotropically etched to form fine patterns 210a. The fine patterns 210a form fine line and space patterns repeatedly formed at the fine pitch P which is about ½ of the first pitch 2P.

FIG. 3C does not illustrate the first mask patterns 30 or the second mask patterns 50a because they are completely removed by dry etching the etch film 210. However, the method of forming the fine patterns of the semiconductor device according to exemplary embodiments of the present invention is not limited to the drawings.

The fine patterns 210 are formed in the substrate 100 as described with reference to FIGS. 3A through 3C, so that the fine line and space patterns can be repeatedly formed at a fine pitch of about ½ that typically embodied by photolithography. Therefore, the highly fine patterns repeatedly formed by the fine pitch exceeding the resolution restriction in photolithography can be easily embodied.

Figure 4:
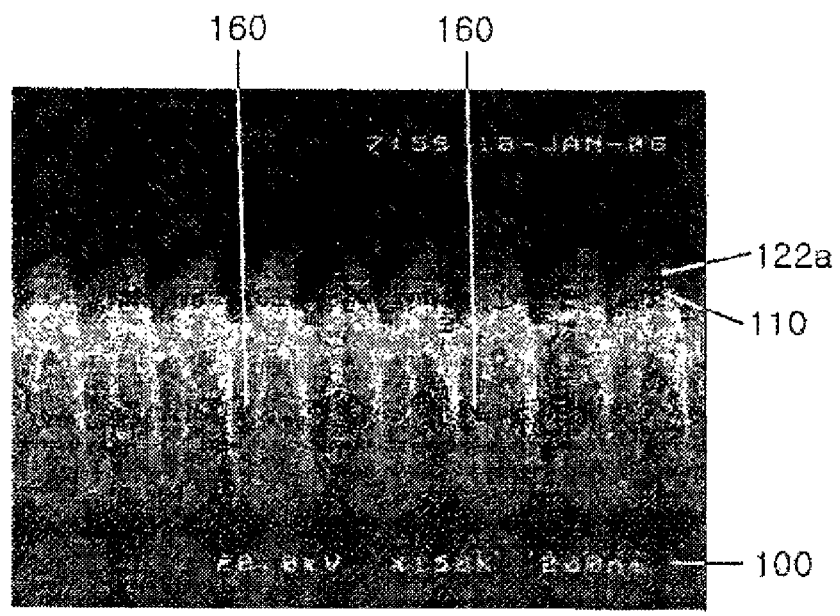
FIG. 4 is a scanning electron microscope (SEM) image showing a section of a substrate structure when an isolation region is formed in a semiconductor substrate according to a method of forming fine patterns of a semiconductor device according to an exemplary embodiment of the present invention.

FIG. 4 is a scanning electron microscope (SEM) image showing a section of a substrate structure when the isolation region is formed in the semiconductor substrate 100 according to the method of forming the fine patterns of the semiconductor device according to the exemplary embodiment of the present invention described with reference to FIGS. 2A through 2E, after the etching for forming the trenches 160 described with reference to FIG. 2D.

In FIG. 4, reference numerals common to FIGS. 1A through 1H denote equivalent elements. In this case, a semiconductor substrate 100 is a silicon substrate, and nitride film patterns 122a are composed of, for example, silicon nitride ($Si_3N_4$). It can be noted that the plurality of trenches 160 formed in the semiconductor substrate 100 have improved profiles.

Figure 5:
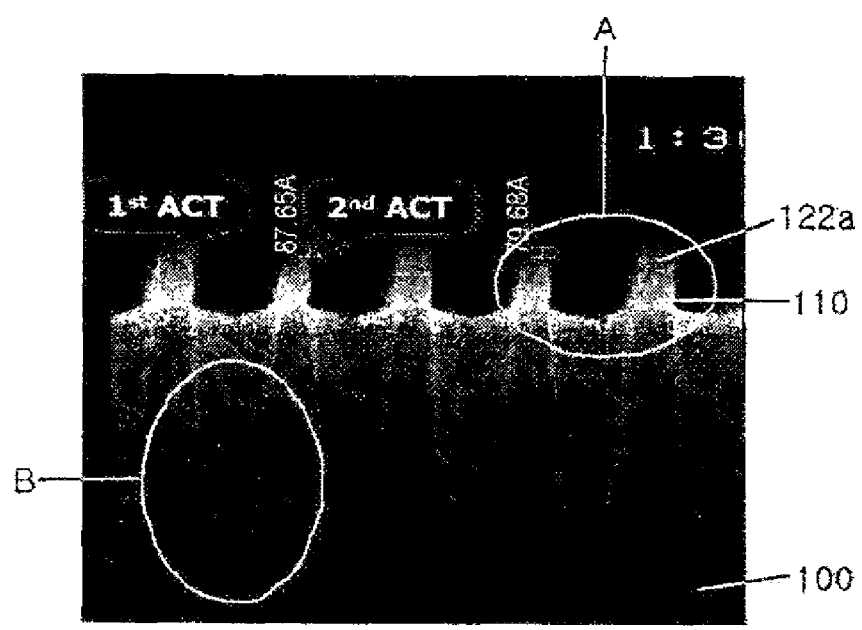
FIG. 5 is a comparison SEM image showing a section of a substrate structure when an isolation region is formed in a semiconductor substrate according to a method of forming fine patterns of a semiconductor device according to an exemplary embodiment of the present invention while omitting the removal of portions of a buffer layer covering upper surfaces of first mask patterns.

FIG. 5 is a comparison SEM image showing a section of a substrate structure when the isolation region is formed in the semiconductor substrate according to the method of forming the fine patterns of the semiconductor device according to another exemplary embodiment of the present invention described with reference to FIGS. 2A through 2E while omitting the removal of the portions of the buffer layer 40 which cover the upper surfaces of the first mask patterns 30. FIG. 5 shows the sectional structure after filling the insulating film 170 into the trenches 160 and partially removing the insulating film 170 from the upper surface thereof.

Referring to FIG. 5, the buffer layer 40 is not removed from the first mask patterns 30 causing a height difference during the subsequent etching of the buffer layer 40 between the first mask patterns 30 and the second mask patterns 50a using the first mask patterns 30 and the second mask patterns 50a as an etch mask. Therefore, the nitride film patterns 122a constituting the hardmask patterns 120 are stepped, as in the portion denoted by "A" in FIG. 5. Consequently, the trenches are asymmetrical as in the portion denoted by "B" of FIG. 5.

As described in the method of forming hardmask patterns and the method of forming fine patterns of a semiconductor device according to exemplary embodiments of the present invention, double patterning is performed by forming first mask patterns having a pitch 2P that is about two times the pitch P of the intended final patterns, then forming second mask patterns in the spaces between adjacent first mask patterns. Therefore, patterns can be repeatedly formed at a fine pitch of about ½ that typically embodied by photolithography, to thereby readily overcome the resolution restrictions of photolithography.

For example, after forming the first mask patterns and the second mask patterns the buffer layer portions covering the upper surfaces of the first mask patterns are removed before removing the buffer layer between the first mask patterns and the second mask patterns, so that the buffer layer is etched while the upper surfaces of the first and second mask patterns are simultaneously exposed. Accordingly, the heights of the first mask patterns and the second mask patterns remain similar even after removing the buffer layer, thereby preventing an asymmetrical structure from occurring in an etch film which is subjected to subsequent etching for patterning an underlying structure using the first mask patterns and the second mask patterns as an etch mask.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming hardmask patterns, comprising:
    forming a hardmask layer on a substrate;
    forming a plurality of first mask patterns on the hardmask layer;
    forming a buffer layer on the plurality of first mask patterns an upper surface of the buffer layer defining recesses between adjacent first mask patterns;
    forming second mask patterns within the recesses formed in the upper surface of the buffer layer;
    partially removing the buffer layer to expose upper surfaces of the plurality of first mask patterns;
    partially removing the buffer layer using the plurality of first mask patterns and the second mask patterns as an etch mask to expose the hardmask layer between the first mask pattern and the second mask pattern; and
    etching the hardmask layer using the plurality of first mask patterns and the second mask patterns as an etch mask to form hardmask patterns.

2. The method of claim 1, wherein the hardmask layer is composed of a material selected from the group consisting of oxide, nitride and a combination of these materials.

3. The method of claim 2, wherein the first mask patterns and the second mask patterns are each composed of polysilicon.

4. The method of claim 1, wherein the upper surface of the hardmask layer is an oxide film, and the buffer layer is an oxide film.

5. The method of claim 1, further comprising, after forming the plurality of first mask patterns and before forming the buffer layer, removing the hardmask layer exposed between the plurality of first mask patterns from the upper surface of the hardmask layer to a depth equal to a first thickness to form low surface portions of the hardmask layer,
    wherein the buffer layer covers the plurality of first mask patterns and the low surface portions to the first thickness.

6. The method of claim 1 wherein the portions of the buffer layer are wet etched.

7. The method of claim 6, wherein the buffer layer is an oxide film, and an etchant including fluoride (F) is used for removing the portions of the buffer layer.

8. The method of claim 7, wherein the etchant is diluted hydrogen fluoride (DHF), ammonium fluoride ($NH_4F$) or a combination of these materials.

9. The method of claim 1, wherein the portions of the buffer layer are dry etched.

10. The method of claim 9, wherein the buffer layer is an oxide film, and an etchant including fluoride is used for dry etching the portions of the buffer layer.

11. The method of claim 10, wherein the etchant is mixed gas formed of a fluorocarbon having the formula of CxFy (where x and y are each an integer from one to ten), oxygen ($O_2$) and argon (Ar).

12. A method of forming hardmask patterns, comprising:
forming a hardmask layer on a substrate;
forming a plurality of first mask patterns on the hardmask layer at a first pitch;
forming a buffer layer covering the plurality of first mask patterns, and having an upper surface having recesses between adjacent first mask patterns;
forming second mask patterns filling in the recesses formed in the upper surface of the buffer layer,
partially removing the buffer layer to simultaneously expose upper surfaces of the plurality of first mask patterns and the upper surfaces of the second mask patterns;
partially removing the buffer layer using the plurality of first mask patterns and the second mask patterns as an etch mask to expose the upper surface of the hardmask layer between the first mask pattern and the second mask pattern; and
etching the hardmask layer using the first mask patterns and the second mask patterns as an etch mask to form a plurality of hardmask patterns at a second pitch which is about ½ of the first pitch.

13. The method of claim 12, wherein the hard mask layer is an oxide film, a nitride film or a combination of these films.

14. The method of claim 12, wherein the first mask pattern and the second mask pattern are each composed of polysilicon.

15. The method of claim 12, wherein the second mask patterns are repeatedly formed at a pitch equal to the first pitch.

16. The method of claim 12, wherein the upper surface of the hardmask layer is an oxide film, and the buffer layer is an oxide film.

17. The method of claim 12, further comprising, after forming the plurality of first mask patterns and before forming the buffer layer, removing the hardmask layer exposed between the plurality of first mask patterns from the upper surface of the hardmask layer to a depth equal to a first thickness to form low surface portions of the hardmask layer,
wherein the buffer layer covers the plurality of first mask patterns and the low surface portions to the first thickness.

18. The method of claim 12, wherein the first mask patterns and the second mask patterns are each formed to have a width which is ¼ of the first pitch.

19. The method of claim 12, wherein the portions of the buffer layer are wet etched.

20. The method of claim 19, wherein the buffer layer is an oxide film, and an etchant including fluoride (F) is used for removing the portions of the buffer layer.

21. The method of claim 20, wherein the etchant is diluted hydrogen fluoride (DHF), ammonium fluoride ($NH_4F$) or a combination of these materials.

22. The method of claim 12, wherein the portions of the buffer layer are dry etched.

23. The method of claim 22, wherein the buffer layer is an oxide film, and an etchant including fluoride is used for dry etching the portions of the buffer layer.

24. The method of claim 23, wherein the etchant is a mixed gas of a fluorocarbon having the formula of CxFy (where x and y are each an integer from one to ten), oxygen ($O_2$) and argon (Ar).

25. A method of forming fine patterns of a semiconductor device, comprising:
forming a first oxide film on a substrate;
forming a hardmask layer by stacking a nitride film and a second oxide film on the first oxide film;
forming a plurality of first mask patterns on the second oxide film;
forming a third oxide film on the first mask patterns, the third oxide film having an upper surface that defines recesses between adjacent first mask patterns;
forming second mask patterns within the recesses formed in the upper surface of the third oxide film;
partially removing the third oxide film to expose the upper surfaces of the first mask patterns;
partially removing the third oxide film to expose the hardmask layer using the first mask patterns and the second mask patterns as an etch mask;
etching the hardmask layer using the first mask patterns and the second mask patterns as an etch mask to form hardmask patterns;
etching the first oxide film and the substrate using the hardmask patterns as an etch mask to form trenches in the substrate, and
filling the trenches with an insulating film to form an isolation region.

26. The method of claim 25, wherein the first mask patterns and the second mask patterns are each composed of polysilicon.

27. The method of claim 25, further comprising: after forming the plurality of first mask patterns and before forming the third oxide film, removing the second oxide film exposed between the plurality of first mask patterns from the upper surface of the hardmask layer to a depth equal to a first thickness to form low surface portions of the second oxide film,
wherein the third oxide film covers the plurality of first mask patterns and the low surface portions to the first thickness.

28. The method of claim 25, wherein the portions of the third oxide firm are wet etched.

29. The method of claim 25, wherein the portions of the third oxide firm are dry etched.

30. A method of forming fine patterns of a semiconductor device, comprising:
forming a hardmask layer on an etch film subjected to etching on a substrate;
forming a plurality of first mask patterns on the hardmask layer;
forming a buffer layer on the first mask patterns, the buffer layer having an upper surface defining recesses between adjacent first mask patterns;
forming second mask patterns within the recesses formed in the upper surface of the buffer layer;
partially removing the buffer layer to expose upper surfaces of the first mask patterns;
partially removing the buffer layer using the first mask patterns and the second mask patterns as an etch mask to expose the hardmask layer;
etching the hard mask layer using the first mask patterns and the second mask patterns as an etch mask to form hardmask patterns; and
etching the etch film using the hardmask patterns as an etch mask.

31. The method of claim 30, wherein the buffer layer is an oxide film; and the first mask patterns and the second mask patterns are each composed of polysilicon.

32. The method of claim 30, further comprising, after forming the plurality of first mask patterns and before forming the buffer layer, removing the hardmask layer exposed between the plurality of first mask patterns from the upper surface of the hardmask layer to a depth equal to a first thickness to form low surface portions of the hardmask layer, wherein the buffer layer covers the first mask patterns and the low surface portions to the first thickness.

33. The method of claim 30, wherein the portions of the buffer layer are wet etched.

34. The method of claim 30, wherein the portions of the buffer layer are dry etched.

* * * * *